United States Patent [19]

Ghannam et al.

[11] Patent Number: 5,108,936

[45] Date of Patent: Apr. 28, 1992

[54] METHOD OF PRODUCING A BIPOLAR TRANSISTOR HAVING AN AMORPHOUS EMITTER FORMED BY PLASMA CVD

[75] Inventors: Moustafa Y. Ghannam, Leuven-Heverlee; Robert Mertens, Linden; Johan Nijs, Kessel-lo, all of Belgium

[73] Assignee: Interuniveritair Micro Elektronica Centrum, Netherlands

[21] Appl. No.: 704,674

[22] Filed: May 21, 1991

Related U.S. Application Data

[63] Continuation of Ser. No. 415,384, Sep. 28, 1989, abandoned, which is a continuation of Ser. No. 184,392, Apr. 20, 1988, abandoned, which is a continuation-in-part of Ser. No. 783,182, Oct. 2, 1985, abandoned.

[30] Foreign Application Priority Data

Oct. 2, 1984 [NL] Netherlands ............... 8403005
Jun. 19, 1985 [NL] Netherlands ............... 8501769

[51] Int. Cl.$^5$ .................. H01L 21/00; H01L 21/02; H01L 21/265
[52] U.S. Cl. ..................... 437/31; 437/101; 437/937; 148/DIG. 1; 148/DIG. 11; 357/2; 357/16; 357/34
[58] Field of Search ....... 148/33.4, DIG. 1, DIG. 11; 437/31, 101, 937; 357/2, 16, 34

[56] References Cited

U.S. PATENT DOCUMENTS

| | | | |
|---|---|---|---|
| 4,015,282 | 3/1977 | Shaw | 357/16 |
| 4,062,034 | 12/1977 | Matsushita et al. | 357/64 |
| 4,127,861 | 11/1978 | Deneuville | 357/59 B |
| 4,193,821 | 3/1980 | Feng et al. | 437/231 |
| 4,227,942 | 10/1980 | Hall | 357/55 |
| 4,317,844 | 3/1982 | Carlson | 437/101 |
| 4,357,179 | 11/1982 | Adams et al. | |
| 4,410,559 | 10/1983 | Hamakawa et al. | 437/101 |
| 4,446,168 | 5/1984 | Kato et al. | 437/101 |
| 4,451,538 | 5/1984 | Tanner | |
| 4,578,696 | 3/1986 | Ueno et al. | 357/2 |
| 4,593,305 | 6/1986 | Kurata et al. | 357/34 |
| 4,604,636 | 8/1986 | Dalal | 357/2 |

FOREIGN PATENT DOCUMENTS

| | | | |
|---|---|---|---|
| 2309981 | 11/1976 | France . | |
| 2352404 | 12/1977 | France . | |
| 57-060872 | 4/1982 | Japan | 357/2 |
| 0090933 | 6/1982 | Japan | 437/101 |
| 57-090933 | 6/1982 | Japan | 437/101 |
| 57-187935 | 11/1982 | Japan | 437/101 |
| 0096722 | 6/1984 | Japan . | |
| 59-106153 | 6/1984 | Japan | 357/2 |
| 0211265 | 11/1984 | Japan . | |
| 0211266 | 11/1984 | Japan . | |
| 2124826 | 2/1984 | United Kingdom | 357/2 |

OTHER PUBLICATIONS

Ghandhi, S., VLSI Fabrication Principles, Chaps. 7, 8, & 9, Wiley & Sons, 1983.
Sze, S., VLSI Technology, Chap. 3, McGraw-Hill, 1983.
Sze, S., VLSI Technology, Chapter 3, pp. 93–94, McGraw-Hill, 1983.
Kroemer, H., Theory of a Wide-Gap Emitter for Transistors, Proceedings of the IRE, vol. 45, No. 11, Nov. 1957, pp. 1535–1537.

(List continued on next page.)

Primary Examiner—Brian E. Hearn
Assistant Examiner—B. Everhart

[57] ABSTRACT

A bipolar hetero-junction transistor has an emitter formed which consists of doped and hydrogenated semiconductor material which is at least partly in amorphous form. A high current gain ($\beta$) is obtained due to the wide bandgap in the emitter material. Preferably, the layer forming the emitter consists of microcrystalline silicon which is doped and hydrogenated. This yields a small base resistance which is preferable for high frequency purposes. The amorphous bipolar hetero-junction transistor can be produced by a CVD-technique, by using a plasma or by photodissociation. The transistor having a microcrystalline emitter layer can be produced by one of the above methods or by heating an amorphous emitter layer.

8 Claims, 3 Drawing Sheets

OTHER PUBLICATIONS

Petersen, K., Fabrication and Operation of an Amorphous-Emitter Transistors, IEDM, Technical Digest, Dec. 1974, pp. 569-572.

Matsushita, T., A Silicon Heterojunction Transistor, Appl. Phys. Lett., vol. 35, No. 7, Oct. 1979, pp. 549-550.

Ghannam, M., A Silicon Bipolar Transistor with a Hydrogenated Amorphous Emitter, IEDM, Dec. 1984, pp. 746-748.

Petersen, K. E., Amorphous-Crystalline Heterojunction Transistors, IEEE Trans. on Elect. Devices, vol. ED-23, No. 4, Apr. 1976, pp. 471-477.

Carlson, D. E., Amorphous Silicon Solar Cells, IEEE Tran. on Elect. Devices, vol. Ed-24, No. 4, Apr. 1977, pp. 449-453.

Brodsky, M. H., Doping of Sputtered Amorphous Semiconductors, IBM Technical Disclosure Bulletin, vol. 19, No. 12, May 1977, pp. 4802-4803.

T. Ichimura et al.,—"a-SI:H Films by D.C. Glow Discharge", 1046B Extended Abstracts 1980, vol. 80-2, Pennington, N.J., Abstract No. 570.

G. Rajeswaran et al.,—"Substrate Temperature Dependence of Microcrystgallinity in Plasma-Deposited, Boron-Doped Hydrogenatred Silicon Alloys", Appl. Phys. Lett. 43(11) Dec. 1983, pp. 1045-1047.

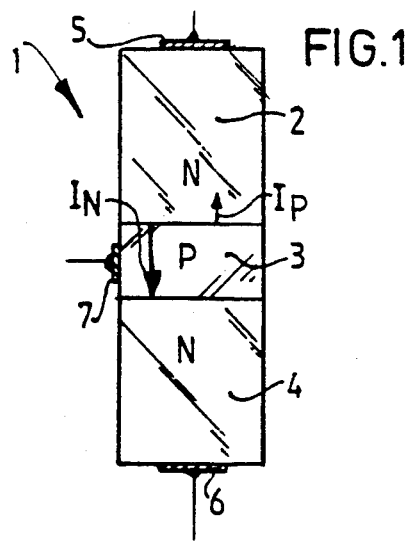
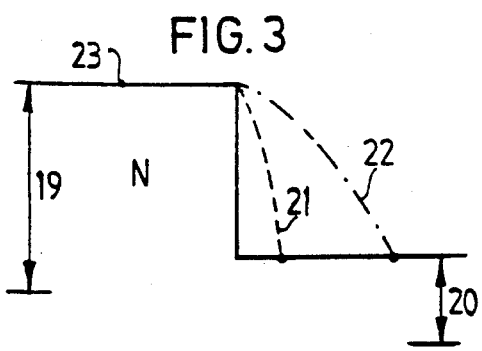
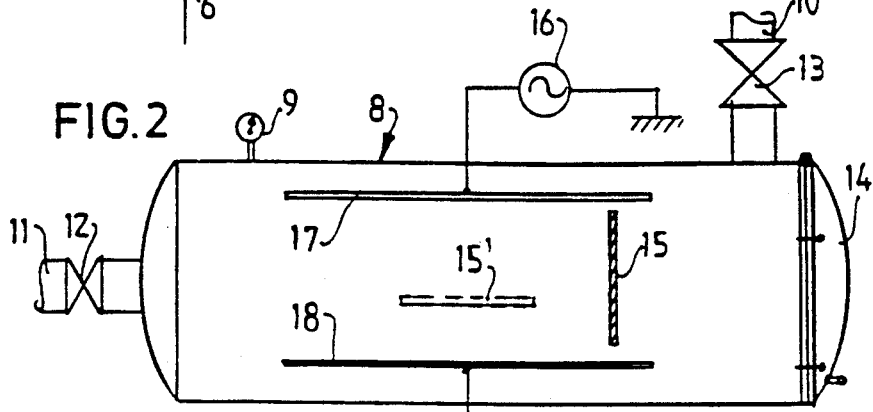
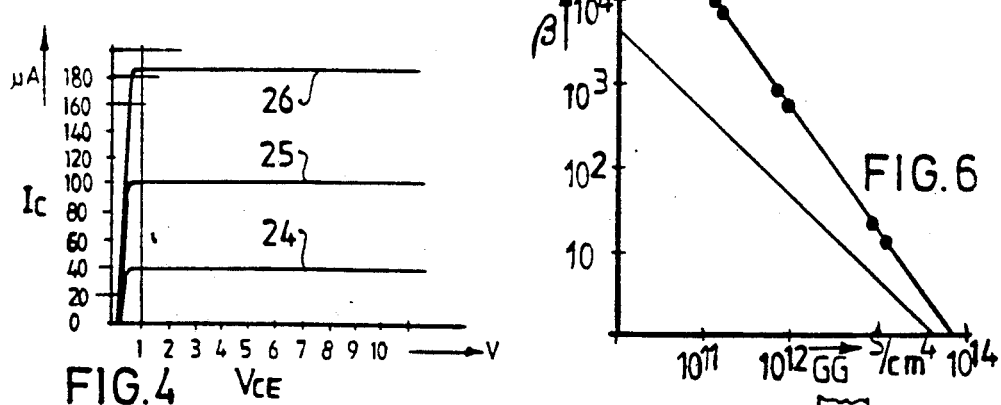
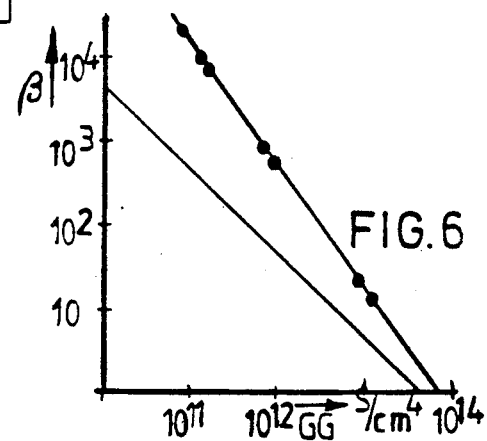
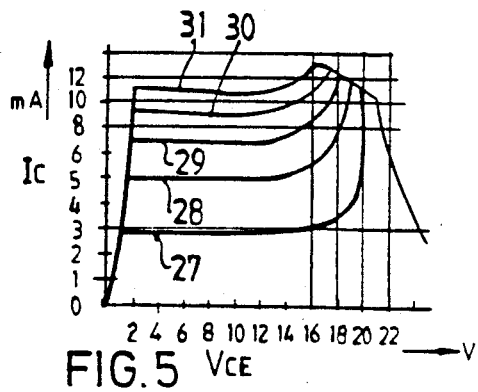
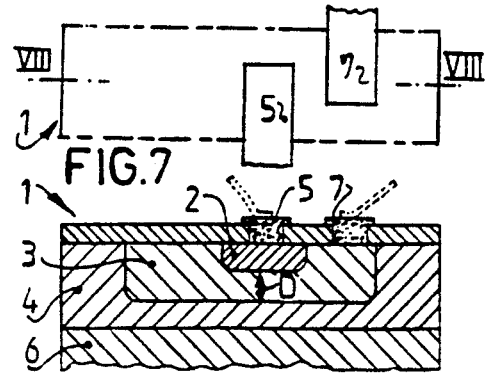

METHOD OF PRODUCING A BIPOLAR TRANSISTOR HAVING AN AMORPHOUS EMITTER FORMED BY PLASMA CVD

This is a continuation of Application Ser. No. 07/415,384 filed on Sep. 28, 1989, now abandoned, which is a continuation, of application Ser. No. 07/184,392 filed on Apr. 20, 1988, now abandoned, which is a continuation-in-part of Ser. No. 783,182 filed on Oct. 2, 1985, now abandoned.

The present invention relates to methods of producing bipolar transistors.

Prior art bipolar transistors were produced by high temperatures, viz. 700° C. or higher, at which processed epitaxial layers were applied or diffusion took place. Under such high temperatures interfaces between base, emitter and collector layers would become relatively undefined, due to diffusion of either dopants or semiconductor material.

In this time era of further micronisation, even in the submicron area, such interdiffusion limits the dimensions in two (or three) directions such exactly defined semiconductor structures as transistors.

By means of the present invention it has become possible to produce transistors with very small dimensions, especially in the vertical direction, viz. having thicknesses of less than 0.5 $\mu$m of the base and emitter layers of the transistor.

The method of the present invention of producing a bipolar transistor substantially of semiconductor material, e.g. of silicon, comprises the steps of:
providing a crystalline, doped collector part of one conductivity type at a substrate;
applying a doped base layer of the opposite conductivity type; and
applying a doped emitter layer of said first conductivity type onto said base layer at a temperature below 450° C., by means of a plasma.

According to a further aspect of the present invention the plasma for forming the emitter layer substantially comprises silane ($SiH_4$), phosphine ($PH_3$) and hydrogen ($H_2$), such that the emitter layer substantially consists of doped and hydrogenated semiconductor material, at least partly in amorphous form, viz. ranging from completely amorphous hydrogenated silicon ($\alpha$-Si:H), to microcrystalline silicon ($\mu$c-Si). The microcrystalline silicon consisting of small crystallines showing typical average dimensions between 2-100 nm, embedded in an amorphous matrix of a continuous structure of grains and grain boundaries.

Amorphous silicon as such, that is doped and hydrogenated, is known for the production of solar cells, which need extensive layers of this material, see for instance U.S. Pat. No. 4,457,538.

For the production of solar cells, microcrystalline silicon is known for example from U.S. Pat. No. 4,357,179 and from articles in Extended Abstracts vol. 00-21, 1980 of T. Ichimura e.a. "$\alpha$-Si: H-films by DC glow discharge" and in Applied Physics Letters vol. 43, No. 11, December 1983 (N.Y., U.S.) by G. Rajeswaran e.a. "Substrate temperature dependence of microcrystallining in plasma-deposited boron-doped hydrogenated silicon alloys".

The transistors formed according to the above-mentioned method show a high (pseudo)-bandgap and provide a hetero-junction between base and emitter layers, such that high gains can be achieved by means of such transistors.

The resisting value of such layers can be 1-10 $\Omega$cm or even $10^{-3}$ $\Omega$cm in a case of $\mu$c-Si.

In a preferred embodiment of the invention the layer forming the base has a thickness of less than 0.5 $\mu$m, which is made possible by the sharply defined heterojunction between amorphous or microcrystalline silicon and the monocrystalline silicon. Due to the thin base layer, the base resistance value is small. This makes such transistors very useful for high frequency purposes.

Preferably, hydrogen ($H_2$) is added to the plasma with a relatively high partial pressure such that the layer forming the emitter substantially consists of doped and hydrogenated silicon material in microcrystalline form.

According to another preferred method according to this invention, the emitter layer is applied by means of a plasma at a temperature of approximately 250° C., under conditions for the passing silicon in amorphous form. The substrate, including collector and base layers, is cleaned beforehand, such that a significant epitaxial layer starts to grow from the base layer as an emitter layer.

From the prior art further there is known a bipolar hetero-junction transistor having a high current gain ($\beta$-factor), from FR-A-2352404, in which a hetero-junction is formed between AlGaAs and GaAs using III-V techniques with AlGaAs having a bandgap of 2.3 eV. This epitaxial technique can only be controlled with difficulty and is very expensive.

Another technique in the silicon technology for producing bipolar hetero-junction transistors is the SIPOS technique (see for example FR-A-2309981) in which the layer forming the emitter is made from an $O_2$-$SiH_4$-$N_2O$-$PH_3$-vapour at about 650° C. so that a phosphorus-doped Si-$SiO_2$-polycrystalline structure is obtained. Subsequently, in order to reduce the state density at the junction surface, the material is annealed at a temperature of 900° C. in a $H_2$ ambient, after which the emitter layer exhibits an energy gap of 1.5 eV. A disadvantage of this technique is that due to annealing at a high temperature, phosphorus diffuses into the base layer and disturbs the accurately defined emitter-base junction. Thus, the transistion between the energy gap in the emitter layer and the energy gap in the base layer becomes less sharply defined. Further, such a transistor has a high resistance value of the emitter because of the insulating $SiO_2$.

Further, the following prior art is known to the applicant:
U.S. Pat. Nos. 4,127,861, 4,523,370, 4,272,641, 4,253,882, 4,604,636, Appl. Phys. Letters, vol. 35, No. 7, October 1979, pp. 549–550.

Furthermore, the following citations are known:
U.S. Pat. Nos. 4,062,034, 4,605,941, 4,578,696, 4,535,531, 4,593,305, Appl. Phys. Letters, vol. 55, No. 4, February 1984, pp. 1012–1019.

Further details, advantages and features of preferred embodiments of the invention will hereinafter be described, with reference to drawings which show:

FIG. 1 shows a diagrammatic representation of a bipolar hetero-junction npn-transistor in an embodiment of the present invention;

FIG. 2 shows a diagrammatic sectional view of a device for carrying out a preferred method of the invention;

FIG. 3 shows a diagrammatic representation of the transition of the energy in the emitter-base junction of the transistor of FIG. 1;

FIG. 4 shows a graph of the behaviour for low current values of a npn-transistor in an embodiment of the present invention;

FIG. 5 shows a graph of the behavior for high current values of an npn-transistor in an embodiment of the present invention;

FIG. 6 shows a graph of the current amplification factor $\beta$ of a transistor of FIG. 1 plotted against the base Gummel number GG;

FIG. 7 shows a strongly enlarged top view of a bipolar hetero-junction transistor of FIG. 1;

FIG. 8 shows a section across line VIII—VIII of FIG. 7; and

Figure 9:
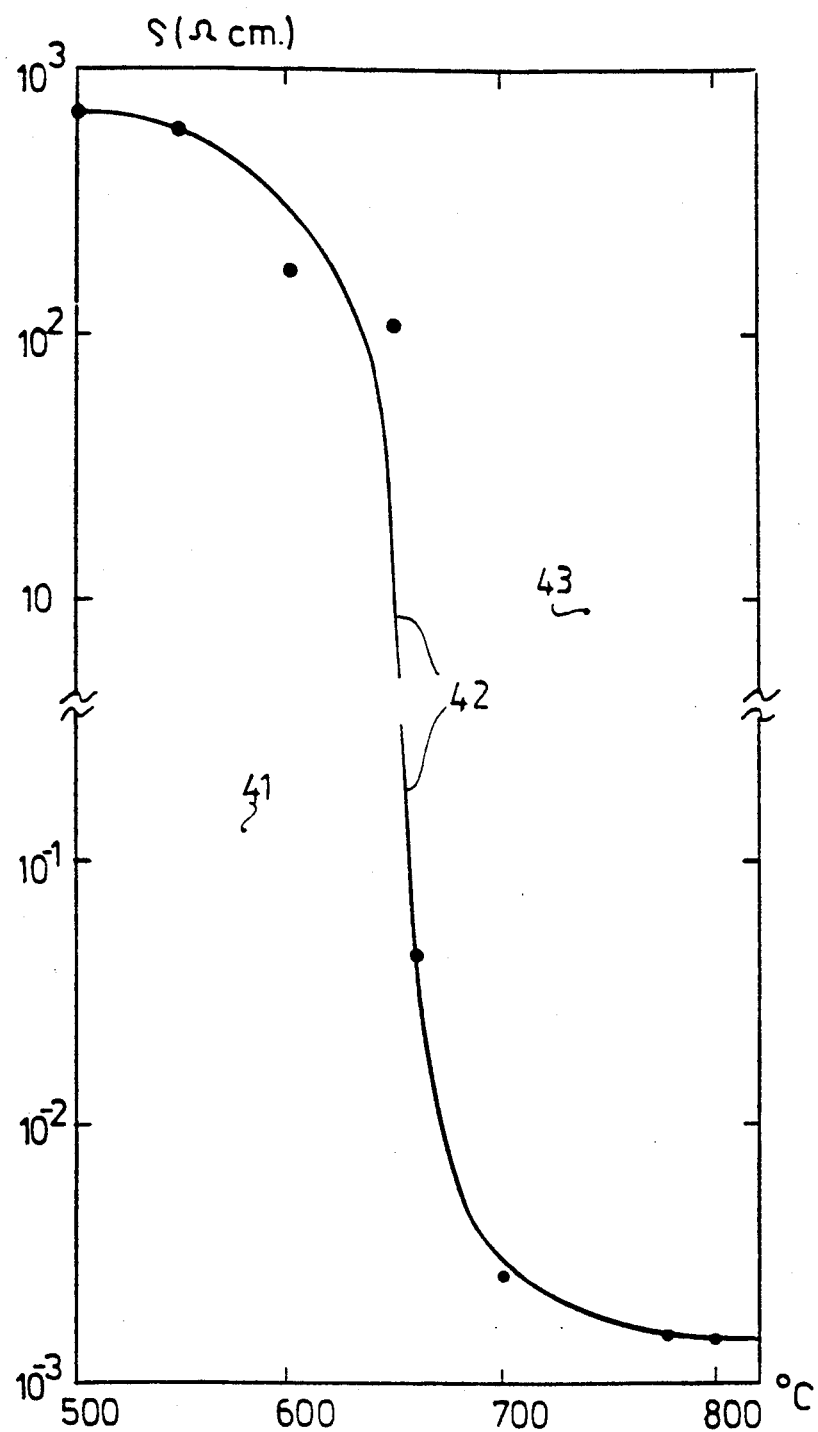
FIG. 9 shows a graph showing the transition from amorphous to microcrystalline silicium.

A npn-transistor 1 embodying the invention (FIG. 1, 7, 8) is formed by an emitter layer 2 provided with an emitter contact 5 and consisting of phosphorus-doped and hydrogenated silicon in an amorphous or microcrystalline form; by an acceptor-doped base layer 3 provided with a base contact 7 and consisting of monocrystalline silicon; and by a donor-doped collector layer 4 of monocrystalline silicon provided with a collector contact 6. The thickness D (FIG. 8) can for instance be only a few tenths of a micrometer. The current amplification factor $\beta$ is defined as follows:

$$\beta = \frac{I_C}{I_B} = \frac{I_N}{I_P}$$

wherein $I_N$ is the absolute value of the electron current from emitter to collector, $I_P$ is the value of the hole current from base to emitter, and $I_C$ is the value of the collector current. The second = sign only applies when the base recombination value is negligible and the recombination at the junction between amorphous (or microcrystalline) and monocrystalline material is negligible.

The emitter layer of the transistor embodying the invention is arranged in a chamber 8 held at a temperature of about 250° C. It is provided with a pressure gauge 9, with inlet and outlet channels 10, 11 including clocks 12, 13 and with a removable cover 14 so that at least one silicon chip 15, provided with the collector layer and the base layer and as precursor silane (SiH$_4$) and AsH$_3$ or phosphine (PH$_3$ about 1% of the amount of (SiH$_4$), can be disposed in the chamber 12. By means of an alternating voltage source with a preset power value or, as the case may be, a direct voltage source 16, a plasma is generated between the electrodes 17, 18. The emitter layer is then applied to the base layer at a pressure of 1 to 1000 mTorr and at a temperature of 250° C. The substrate temperature determines the amount of hydrogen that remains in the amorphous silicon emitter layer, e.g. for 250° C. the amount of hydrogen that remains in the film is typically 5–10%. Due to the contents of the gas mixture, the sintering at high temperature, essential for, for instance, the SIPOS-techniques can be dispensed with. The electrode 18 is grounded. The electrode 17 is connected to the voltage source, which is also grounded. Since a plasma is used, the temperature can be kept low. The silicon chip is disposed either vertically (indicated by the solid line 15) or horizontally (indicated by the broken line 15'). The layers forming the base and the collector are applied by means of methods known per se. In order to obtain satisfactory contacts Ti (0.5 μm)-Al(1 μm) were vapour deposited on the amorphous silicon layer and on the layer forming the base. For further improviding the contacts, tempering is carried out at 290° C. for 25 minutes. Tempering at a high temperature, as in the SIPOS-technique, can be dispensed with since from the emitter layer is already hydrogenated by formation from the plasma.

To produce emitter layer in microcrystalline form, i.e. an amorphous matrix with very small crystalline areas therein, the method was used at a pressure of about 50 mTorr in the chamber 8. The voltages source supplied a smaller power value to the plasma than it did at producing the amorphous emitter layer. The exact pressure value and the exact power value must be determined from the dimensions of the chamber.

The transition between an energy gap 19 in the phosphorus-doped N layer and an energy gap 20 in the slightly doped P layer is illustrated in FIG. 3, which also shows the doping profile. The energy gap 19 is, for example, 1.6 eV and the energy gap 20 is, for example, 1.1 eV. The solid line indicates the doping profile at the npn junction (emitter base) of the transistor embodying the invention. The broken lines 21, 22 represent the doping profile in accordance with the known techniques such as the diffusion technique and the SIPOS-technique for applying the emitter layer. In that case, due to the high temperature, donor material (phosphorus) can diffuse as far as into the base layer. The broken line 21 indicates, by way of example, a doping profile in a SIPOS-transistor sintered for a short time. The broken line 21 indicates by way of example a doping profile in a transistor in accordance with the diffusion technique. Owing to the accurately defined emitter-base junction in the transistor embodying the invention the thickness of the base layer can be chosen smaller than in the transistors hitherto used, for example, smaller than 0.5 μm. This brings about an increase in collector current $I_C$ and hence a higher $\beta$. At a given value of $\beta$ a lower value of the base resistance is thus obtained.

The lines 24,25,26,27,28,29,30,31 indicate the collector current $I_C$ (in μA (FIG. 4) in mA (FIG. 5) of the transistor embodying the invention using α-Si:H at a constant case current $I_B$ of 10 μA, 20 μA, 30 μA, 200 μA, 400 μA, 600 μA, 800 μA and 1 mA, respectively, in relation to the collector-emitter voltage $V_{ce}$ in Volts plotted on the abcissae.

In FIG. 6 the current amplification factor $\beta$ is plotted vertically against the base Gummel number. The base Gummel number is defined as being the quotient of the density per surface and the diffusion coefficient of minority charge carriers in the base layer. The electron current $I_N$ and hence the $\beta$ factor are inversely proportional to the base Gummel number. The solid line (FIG. 6) illustrates the relationship for bipolar homo-junction transistors. FIG. 6 shows measuring points on the transistor embodying the invention, using α-Si:H. Since the hetero-junction transistor has a high base Gummel number and at this base Gummel number an approximately 5 to 6 times higher $\beta$ factor, the hetero-junction transistor embodying the invention will exhibit also a higher current amplification factor $\beta$ at lower values of the base Gummel number than the conventional bipolar homo-junction transistors.

It will be understood that a bipolar hetero-junction transistor of the invention can be produced by means of photo dissocation of $SiH_4$, known per se, with the gas in the chamber staying under 450° C.

First results of further experiments show an epitaxial layer of 100 nm at a temperature of 300° C. at the surface.

In the table below (table I) three samples are listed, which have been processed and the processing conditions are mentioned therein:

TABLE I

| | | | Processing conditions of samples 1-3 | | | | | |
|---|---|---|---|---|---|---|---|---|
| | Substrate | | Deposition | | | | | |
| Number of sample | Type | Resistivity (Ohmcm) | Temp. (°C.) | Press. ($10^{-3}$ mbar) | Rf power (W) | Dc bias (V) | Thickness (nm) | Cleaning procedure |
| 1 | n | 2-4 | 250 | 20 | 5 | 0 | 350 | RCA[a], 10% HF dip, $N_2$ dried |
| 2 | n | 2-4 | 270 | 130 | 5 | 0 | 250 | RCA, 10% HF dip, air dried |
| 3 | p | 5-11 | 200 | 160 | 10 | −600 | 85 | RCA, 10% HF dip, $N_2$ dried |

[a]W. Kern, D.A. Puotinen, RCA Review 31, 187 (1970).

While cooling a substrate provided with a base layer at about 300° C., it is possible to produce a bipolar hetero-junction transistor according to the invention by means of chemical vapour deposition (CVD).

It is also possible for obtaining a transistor having a microcrystalline emitter layer by heating a transistor having an amorphous emitter layer from about 550° C. to about 750° C. In FIG. 9 line 42 shows the transition transforming from a-Si into μc-Si, line 42 being resistivity of the material as a function of the temperature for annealing during 20 minutes, the area 41 being amorphous silicon and the area 43 being microcrystalline silicon.

A preferred embodiment of further developments of the techniques of the present invention will now be presented.

At a temperature under 550° C., especially about 250° or 300° C., it has surprisingly proved to be possible to grow an epitaxial layer from a glow discharge of $SiH_4$; this proof is substantiated by Spreading Resistance Profile (SRP) measurements and High Resolution Electron Microscopy (HREM) measurements.

Films were deposited in a Plasma Technology PD80 plasma deposition system. Before deposition, the system was evacuated to $5 \times 10^{-6}$ mbar by a turbo-molecular pump, and during deposition, a roots blower was used. Deposition was performed from a 1% $PH_3$ in $SiH_4$ source to obtain n+ type films. The deposition conditions are summarized in table I. A SRP probe with a probe separation distance of 60 μm was used to determine the resistance distribution of the layers. The local carrier concentration can be calculated from these data using appropriate algorithms.

The layer deposited under the above-mentioned conditions is expected to be amorphous. Due to lower carrier concentrations and carrier mobility in hydrogentated amorphous silicon, resistivity would be expected to be about 100 Ωcm.

Figure 10:
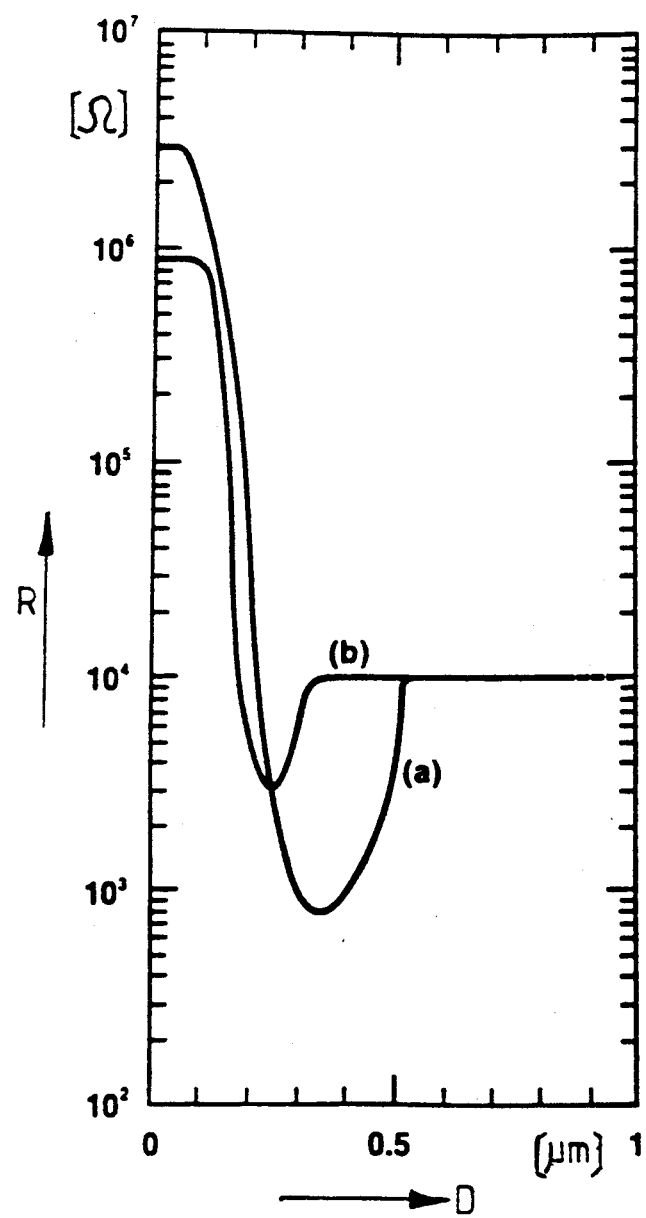
FIG. 10 shows a graph showing the resistance (R) plotted against depth (D) for a layer grown under a second preference.

Surprisingly, FIG. 10 shows minima at the interface indicating the existence of a zone that has a higher conductivity (lower R(esistance)) than the substrate, curve a for sample No. 1 and curve b for sample No. 2, respectively.

High Resolution Electron Microscopy analysis of the interface proves epitaxial growth at the interface. The thickness of the epitaxial layers is about 20 nm at 250° C. Electron diffraction experiments point out that the rest of the deposited layer is amorphous.

Sample No. 1 is the afore-mentioned sample.

Sample No. 2 shows a less deep dip in the SRP profile, while the epitaxial layer seen by means of HREM is much smaller.

Sample No. 3 was recrystallised at 700° C. during 30 minutes. HREM showed that the layer became completely epitaxially regrown. Nevertheless, a high number of microtwins were present, which are in most cases electrically non-active.

It is thought that the presence of HF in the cleaning procedure, just prior to the deposition step, forms a substantial, contribution to the growth of the epitaxial layer, possibly aided by the reducing operation of the $SiH_4$ plasma. Anyhow, it is surprising that no native oxide existed at the surface of the wafers at the start of deposition, at a pressure of $5 \times 10^{-6}$ mbar. In theory, a partial pressure of $H_2O$ en $O_2$ should be as low as $10^{-9}$ mbar for obtaining an oxide free silicon surface at a temperature of 300° C., whereby information of the crystal structure of the underlying layer will reach the layer to be deposited thereon.

Further experiments are aimed to the correlation between the amount of fluor atoms, temperature and required value of the background pressure of especially $O_2$, such that the above-mentioned layers can be deposited.

Further experiments are also aimed at introducing fluor containing gasses in small amounts at deposition of the layers, such as $SiF_4$ or $SiH_2F_2$.

Because the process temperature can be lower than as known from the prior art, junctions between layers can be exactly determined, such that dimensions of the applied layers can be further diminished.

The method according the present invention provides the potential of a high yield of semiconductor devices in large area plasma systems, maintaining flexibility of dopant incorporation and homogenity of thickness and dopant incorporation, because ultrahigh vacuum in the reaction chamber can be dispensed with.

We claim:

1. A method of producing a bipolar transistor of semiconductor material, comprising the steps of:
   a. providing a collector layer of one conductivity type;
   b. providing a crystalline, doped base layer of silicon material of the opposite conductivity type in or on said collector layer;

c. applying a doped emitter layer of hydrogenated silicon material at least partly in an amorphous form of said first conductivity type onto said base layer, said emitter layer having a wider energy band gap than said base layer, said emitter layer being applied onto said base layer at a temperature below 450° C. by means of a chemical vapor deposition, so that the dopant of the emitter layer does not diffuse into the base layer, thereby providing a sharply defined transition between the energy band gap of said emitter layer and the energy band gap of said base layer for producing the bipolar transistor with high gain characteristics.

2. A method according to claim 1, wherein said chemical vapor deposition is a plasma deposition and said plasma substantially comprises;

silane ($SiH_4$);
phosphine ($PH_3$); and
hydrogen ($H_2$).

3. A method according to claim 1, wherein said at least partly amorphous form ranges from completely amorphous hydrogenated silicon ($a$-Si:H) to microcrystalline silicon ($\mu$c-Si) consisting of small crystallines showing typical average dimensions between 2–100 nm, which are embedded in an amorphous matrix of a continuous structure of grains and grain boundaries.

4. A method of processing a semiconductor bipolar transistor, comprising the steps of:

a. providing a doped crystalline collector layer of a first conductivity type;
b. forming a doped crystalline base layer of silicon material of a second conductivity type opposite to said first type in a portion of said collector layer; and
c. forming a doped emitter layer of said first conductivity type in said base layer, said emitter layer having a wider energy band gap than said base layer, said emitter layer being applied onto said base layer by means of a plasma deposition at a temperature below 250° C. so that the dopant of the emitter layer does not diffuse into the base layer, thereby providing a sharply defined transition between the energy gap of said emitter layer and the energy gap of said base layer for producing the bipolar transistor with a high gain characteristics.

5. A method, as claimed in claim 4, wherein said plasma deposition comprises $SiH_4$, $PH_3$ and $H_2$.

6. A method, as claimed in claim 4, wherein said emitter layer comprises a doped and hydrogenated semiconductor material in at least a partly amorphous form.

7. A method, as claimed in claim 6, wherein said emitter layer comprising said partly amorphous form ranges from completely hydrogenated silicon to microcrystalline silicon.

8. A method, as claimed in claim 4, wherein said base layer is formed to a thickness of less than 0.5 $\mu$m.

* * * * *